(12) United States Patent
Weber

(10) Patent No.: US 8,703,278 B2
(45) Date of Patent: Apr. 22, 2014

(54) LIGHT WEIGHT PRINTED WIRING BOARD

(75) Inventor: Mark W. Weber, Zimmeman, MN (US)

(73) Assignee: Honeywell International Inc., Morristown, NJ (US)

( * ) Notice: Subject to any disclaimer, the term of this patent is extended or adjusted under 35 U.S.C. 154(b) by 958 days.

(21) Appl. No.: 11/277,668

(22) Filed: Mar. 28, 2006

(65) Prior Publication Data

US 2007/0237934 A1    Oct. 11, 2007

(51) Int. Cl.
  *B32B 3/02*    (2006.01)
  *B32B 3/08*    (2006.01)
  *H05K 1/03*    (2006.01)

(52) U.S. Cl.
  USPC ........... 428/201; 428/212; 428/116; 428/117; 428/119; 361/748

(58) Field of Classification Search
  USPC ........ 428/901, 195.1, 209, 166, 178, 71, 201, 428/212, 116–117, 119; 361/760, 748; 174/255
  See application file for complete search history.

(56) References Cited

U.S. PATENT DOCUMENTS

| | | | | |
|---|---|---|---|---|
| 4,496,793 A | * | 1/1985 | Hanson et al. | 174/259 |
| 5,552,209 A | * | 9/1996 | McCutcheon | 428/209 |
| 5,619,018 A | * | 4/1997 | Rossi | 174/261 |
| 5,933,323 A | * | 8/1999 | Bhatia et al. | 361/700 |
| 6,122,926 A | * | 9/2000 | Kang et al. | 62/259.2 |
| 6,212,075 B1 | | 4/2001 | Habing et al. | |
| 6,246,582 B1 | | 6/2001 | Habing et al. | |
| 6,297,053 B1 | | 10/2001 | Stemmer | |
| 6,317,331 B1 | | 11/2001 | Kamath et al. | |
| 6,341,071 B1 | * | 1/2002 | Johnson et al. | 361/767 |
| 6,509,529 B2 | | 1/2003 | Kamath et al. | |
| 2002/0011353 A1 | | 1/2002 | Kamath et al. | |
| 2003/0226688 A1 | * | 12/2003 | Jairazbhoy et al. | 174/252 |
| 2004/0033743 A1 | * | 2/2004 | Worley et al. | 442/59 |
| 2004/0104041 A1 | | 6/2004 | Christensen | |

OTHER PUBLICATIONS

Carter, B. "Chapter 17: Circuit Board Layout Techniques". Texas Instruments, Inc.; (2001). pp. 1-32.*

* cited by examiner

*Primary Examiner* — Prashant J Khatri
(74) *Attorney, Agent, or Firm* — Shumaker & Sieffert, P.A.

(57) ABSTRACT

A light weight printed wiring board that is particularly well suited for high-G and/or other weight sensitive applications is provided. In one illustrative embodiment, a light weight PWB is provided that includes a substrate having one or more layers extending generally parallel to a plane. To help reduce the weight of the PWB, the substrate may have or define one or more lighter weight regions. In some cases, the one or more lighter weight regions may consume greater than 25%, 30%, 40%, 50%, 60%, 75% or more of the overall volume of the substrate, and thus the weight of the substrate may be reduced by greater than 25%, 30%, 40%, 50%, 60%, 75% or more.

17 Claims, 7 Drawing Sheets

LIGHT WEIGHT PRINTED WIRING BOARD

GOVERNMENT SUPPORT

This invention was made with government support under U.S. Army TACOM-ARDEC contract number DAAE30-01-9-0100. The government may have certain rights in the invention.

FIELD

The present invention relates generally to printed wiring boards (PWBs) and more particularly to light weight PWBs, particularly for high-G and/or other weight sensitive applications.

BACKGROUND

Printed wiring boards (PWBs) traditionally include multiple layers stacked together. In many cases, the multiple layers alternate between a conducting layer and a dielectric or insulating layer. The conducting layers are often etched, printed or otherwise patterned to form conducting traces or pads to help form desired electrical connections of the PWB. In some cases, there may be vias provided through certain layers to help form electrical connections between conducting traces or pads. In use, many PWBs include a number of components mounted thereon, such as, for example, MEMS devices, integrated circuits, resistors, capacitors, coils, transistors, diodes, and/or other mechanical, electrical, optical, or magnetic components, depending on the application. These components are typically electrically connected to one or more of the conducting layers of the PWB.

PWBs are used in a wide variety of applications, including some high dynamic applications, such as ballistic or other applications. Ballistic applications include, for example, being shot out of a gun as part of a projectile. In ballistic applications, as well as other high dynamic applications, the PWB may be exposed to hundreds or even thousands of times the force of gravity (i.e. G forces). Such high accelerations can cause stress and/or bending of the PWB, which can cause the components to "pop off" the board during high G events. It would be desirable, therefore, to provide a PWB that could withstand high dynamic environments, and/or provide a lighter PWB for other weight sensitive applications such as, for example, portable device applications, flight applications and/or space applications, to name just a few.

SUMMARY

The following summary of the invention is provided to facilitate an understanding of some of the innovative features unique to the present invention and is not intended to be a full description. A full appreciation of the invention can be gained by taking the entire specification, claims, drawings, and abstract as a whole.

The present invention generally relates to printed wiring boards (PWBs), and more particularly to lighter weight PWBs. In some cases, the lighter weight PWBs of the present invention may be particularly useful for high-G and/or other weight sensitive applications. Alternatively, or in addition, the lighter weight PWBs of the present invention may have a higher mechanical resonance, which can prove useful in applications where lower frequency mechanical resonances can interfere with the operation of certain devices (e.g. gyroscopes, inertial sensors, pressure sensors, etc.) mounted on the PWBs.

In one illustrative embodiment, a lighter weight PWB is provided that includes a substrate having one or more layers extending generally parallel to a plane. To help reduce the weight of the PWB, the substrate may have or define one or more lighter weight regions. In some cases, the one or more lighter weight regions may be sized and positioned so that the stiffness of the substrate is relatively uniform across the substrate, but this is not required in all embodiments. While not required, having a relatively uniform stiffness across the substrate may help the PWB remain relatively flat during a high-G event. In some cases, the one or more lighter weight regions may consume greater than 25%, 30%, 40%, 50%, 60%, 75% or more of the overall volume of the substrate, and thus the weight of the substrate may be reduced by greater than 25%, 30%, 40%, 50%, 60%, 75% or more.

In some cases, the substrate may have or define two or more lighter weight regions, where the two or more lighter weight regions form a pattern. The pattern may be a one dimensional pattern, a two dimensional pattern, or a three dimensional pattern, as desired. The pattern may be a regular pattern, such as a pattern having a number of rows and columns of spaced square, rectangular or other shaped lighter weight regions. Other illustrative regular patterns may include honeycomb patterns, a hub and spoke patterns, or any other suitable regular pattern, as desired. The pattern may also be a non-regular pattern, or even a pseudo random pattern, if desired. In some cases, the pattern may extend across a majority of the area defined by the perimeter of the substrate, but this is not required. The one or more lighter weight regions may be filled with a gas such as air, and/or may include a lighter weight solid or liquid, as desired.

The substrate may have an upper surface and a lower surface, wherein at least the upper surface has one or more component mounting locations that are adapted to mount a component. In some cases, the lighter weight regions may be situated between the upper surface and the lower surface of the substrate, and in some cases, not though the upper surface or lower surface of the substrate, but this is not required in all embodiments. In some cases, none of the lighter weight regions extend under, or at least completely under, a component mounting location, but this is not required in all embodiments.

In some embodiments, the one or more layers of the substrate may extend from at least part of the upper surface that corresponds to a component mounting location to the lower surface of the substrate, so that support is not substantially reduced between the lower surface and the upper surface of the substrate at the component mounting location. While not required, this support in or around the component mounting location may be useful in some high-G applications, where significant force may be exerted by the component on the PWB during a high-G event.

BRIEF DESCRIPTION

DETAILED DESCRIPTION

Figure 1:
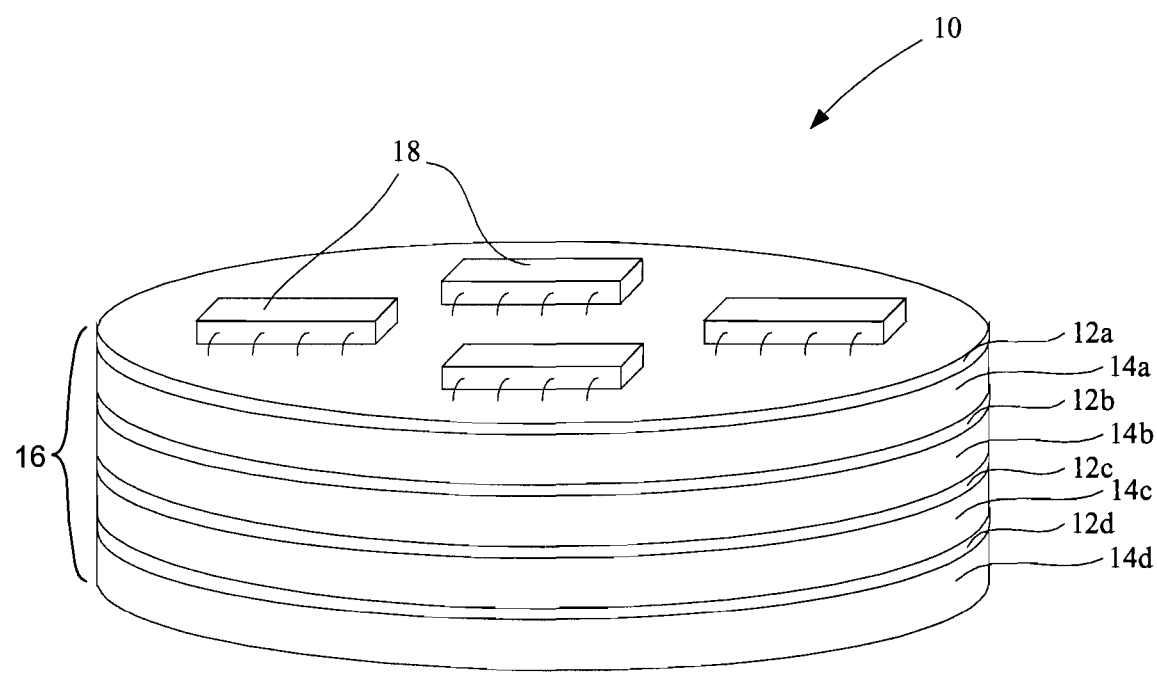
FIG. 1 is a perspective view of a printed wiring board (PWB) in accordance an illustrative embodiment of the present invention.

The following description should be read with reference to the drawings wherein like reference numerals indicate like elements throughout the several views. The detailed description and drawings show several embodiments which are meant to be illustrative of the claimed invention.

FIG. 1 is a perspective view of a printed wiring board (PWB) in accordance with an illustrative embodiment of the present invention. The illustrative PWB 10 includes a substrate 16, wherein the substrate 16 has a number of layers 12a-d and 14a-14d stacked together. In the illustrative embodiment, layers 12a-d are conductive layers, and layers 14a-14d are dielectric or insulating layers. In the illustrative embodiment, one of the conducting layers 12a forms the top layer of the PWB 10, and one of the insulating layers 14d forms the bottom layer, but this is not required in all embodiments. Also, although the illustrative PWB 10 includes four conducting layers 12a-12d and four insulating layers 14a-14d, it is contemplated that the PWB 10 may have any number of conducting layers and insulating layers, as desired. Moreover, it is contemplated that one or more additional layers (not shown) may be included in the substrate 16, as desired. For example, an additional layer of ceramic or metal may be provided to provide additional support to the PWB 10, if desired. In some cases, the layers 12a-12d and 14a-14d may be secured together using a suitable bonding technique such as lamination, welding, etc.

In some cases, one or more of the conductive layers 12a-d may be etched, printed or otherwise patterned on an insulating layer 14a-14d to form conducting traces and/or pads. The conducting traces and/or pads may help form desired electrical connections of the PWB 10. In some cases, one or more vias may also be provided through certain insulating layers 14a-14d and/or conducting layers 12b-12d to help form electrical connections between conducting traces and/or pads on the PWB 10.

In some embodiments, the PWB 10 may include a number of components 18 mounted thereon, such as, for example, one or more MEMS devices (e.g. gyroscopes, inertial sensors, pressure sensors, etc.), integrated circuits, resistors, capacitors, coils, transistors, diodes, and/or other mechanical, electrical, optical, or magnetic components, depending on the application. These components 18 may be electrically connected to one or more of the conducting layers 12a-12d of the PWB 10, but this is not always required.

The illustrative PWB 10 is depicted as having lateral edges extending around a perimeter of the substrate 16, wherein the perimeter has a circular shape. In some applications, such as when the PWB 10 is adapted to be shot out of a gun as part of a projectile, a circular PWB 10 may be desirable. However, more generally, it is contemplated that the PWB 10 may have any desired shape, such as, for example, square, rectangular, or any other shape as desired.

In the illustrative embodiment, the insulating layers 14a-14d are depicted as being relatively thicker than the conducting layers 12a-12d. In some cases, the conducting layers 12a-d may be much thinner than the insulating layers 14a-14d, but this is not required in all embodiments. More generally, it is contemplated that the insulating layers 14a-14d and the conducting layers 12a-12d may have any suitable thickness or relative thicknesses, as desired.

To help reduce the weight of the PWB 10, the substrate 16 may have or define one or more lighter weight regions (see FIGS. 2-9). In some cases, the one or more lighter weight regions may be sized and positioned so that the stiffness of the substrate 16 is relatively uniform across the substrate 16. A relatively uniform stiffness across the substrate 16 may, for example, not promote a flex line along the PWB 10. While not required in all embodiments, having a relatively uniform stiffness across the substrate 16 may help the PWB remain relatively flat during a high-G event.

In some cases, the substrate 16 may have or define two or more lighter weight regions, where the two or more lighter weight regions form a pattern. The pattern may be a one dimensional pattern, a two dimensional pattern, or a three dimensional pattern, as desired. The pattern may be a regular pattern, such as a pattern having a number of rows and columns of spaced square, rectangular or other shaped lighter weight regions. Other illustrative regular patterns may include honeycomb patterns, hub and spoke patterns, or any other suitable regular pattern, as desired. The pattern may also be a non-regular pattern, or even a pseudo random pattern, as desired. In some cases, the pattern may extend across a majority of the area defined by the perimeter of the substrate 16, but this is not required in all embodiments. The one or more lighter weight regions may be filled with a gas such as air, and/or a lighter weight solid or liquid, as desired.

In some cases, the lighter weight regions may be situated between but not through the upper surface and the lower surface of the substrate. In some cases, the lighter weight regions may be adapted to not extend under, or at least completely under, a component mounting location. The component mounting locations may be regions of the substrate 16 that are situated below a component 18. In some embodiments, the one or more layers of the substrate 16 may extend from at least part of the upper surface that corresponds to a component mounting location, to the lower surface of the substrate so that support is not substantially reduced between the lower surface and the upper surface of the substrate at the component mounting location. While not required, this support in or around the component mounting location may be useful in some high-G applications, wherein significant force may be exerted by the component 18 on the PWB 10 during a high-G event.

The illustrative PWB 10 may be fabricated using, for example, conventional PWB manufacturing processes. In some cases, parts of one or more of the layers 12a-12d and/or 14a-14d may be selectively removed to form the one or more lighter weight regions. In some cases, the selective removal step may be performed prior to stacking the layers 12a-12d and 14a-14d together. According to one illustrative method, each layer 12a-12d and/or 14a-14d of the PWB 10 may be tailor made for a desired application, but this is not required.

In one illustrative method, a first PWB 10 layer 14d may be provided. In some cases, a conductive layer 12d may be disposed/patterned on the insulating layer 14d. For example, the conductive layer 12d may be patterned to form traces on the insulating layer 14d according to conventional patterning techniques, such as, for example, printing, etching, photolithography, or any other suitable technique, as desired.

Next, a portion of the insulating layer 14d (and possibly a portion of the conductive layer 12d) may be selectively removed. The portion(s) that may be selectively removed may be in one or more non-critical regions of the insulating layer 14d. Non-critical means regions that are not needed for support and/or for electrical connection purposes. In some cases, parts of conductive layer 12b may also be removed, if desired. The selective removal of one or more non-critical region(s) of the substrate 16 may be accomplished by die cutting, routing, drilling, etching, or any other suitable technique, as desired. In some cases, the illustrative layers 12a-12d and 14a-14d may be configured to form desired structures, such as, for example, trusses, beams, or any other suitable structures within the PWB 10, as further described below.

Once all the desired layers 12a-d and 14a-d have been processed in a similar manner, and in one illustrative embodiment, the layers 16a-d are then stacked and secured together to form PWB 10. In some cases, there may be an adhesive positioned between at least a portion of the layers 12a-12d and 14a-14d to secure the layers together. More generally, any suitable fastening method may be used to secure the layers 12a-12d and 14a-14d together, as desired. In some cases, the selective removal of parts of the substrate 16 may be performed after at least some of the layers 12a-12d and/or 14a-14d are stacked together.

The illustrative PWB 10 may be used in many applications, such as, for example, ballistic applications wherein the PWB is part of a projectile that is shot from a gun. In such applications, the PWB 10 may be subject to high accelerations, such as, for example, tens of thousands of G's. As noted above, the illustrative PWB 10 provides for the selective removal of non-critical regions of the PWB 10 making a lighter weight PWB 10.

Traditional PWBs used in ballistic applications, without having portions selectively removed therefrom, may weigh approximately 0.1 lbs in one example. In some cases, a PWB 10 in accordance with the present invention may weight less than half of the weight of the traditional PWB (e.g. less than 0.05 lbs). In this example, the portions selectively removed may include about 50% of the volume of the overall substrate. The force that may be exerted on the PWB 10 in high-G applications, as well as other applications, can be estimated using the equation F=ma, for a given acceleration. If the weight of the illustrative PWB 10 is reduced to half of the weight of a traditional PWB, the force on the PWB 10 will be about half that of a traditional PWB for a given acceleration. Thus, the illustrative PWB 10 may be able to withstand approximately twice the acceleration of a traditional PWB.

For example, in a ballistic application, such as when the PWB 10 is being fired from a gun as part of a projectile, the force exerted on the PWB 10 may be 10,000, 15,000, 20,000 or more G's. For illustrative purposes, suppose that an acceleration of 20,000 G's causes a traditional PWB to bend sufficiently so that one or more components "pop off" the board. For a traditional PWB, such as one having a weigh of 0.1 lbs, the force acting on the PWB would be about 2,000 lbs. If the illustrative PWB 10 is used, with a reduced weight of 0.05 lbs, the same force of 2,000 lbs would occur at an acceleration of 40,000 G's; twice that of a traditional PWB.

It is contemplated that the weight of the PWB 10 may be able to be reduced by greater than 50% in some cases, allowing the PWB 10 to withstand even higher accelerations. More generally, the selective removal of one or more non-critical regions of the PWB 10, resulting in one or more lighter weight regions, may reduce the weight of the PWB 10 by any desired percentage, as desired, so long as the structure and strength of the PWB 10 is sufficiently retained to function under its anticipated operation conditions. For example, the portions selectively removed from the substrate may be greater than 25%, 30%, 40%, 50%, 60%, 75% or more of the volume of the overall substrate, and the weight of the PWB 10 may be reduced by greater than 25%, 30%, 40%, 50%, 60%, 75% or more. In some cases, the selective removal of the non-critical regions of the PWB 10 may not substantially reduce the stiffness of the PWB 10, and in some cases may be adapted to maintain a relatively uniform stiffness across the PWB 10.

The lighter weight regions of the PWB 10 may also raise the mechanical resonance of the PWB 10, which can prove useful in applications where, for example, lower frequency mechanical resonances can interfere with the operation of certain devices (e.g. gyroscopes, inertial sensors, pressure sensors, etc.) mounted on the PWB 10. More generally, and in some cases, the size and location of the removed portions of the PWB 10 may be selected to "tune" the mechanical resonance of the PWB 10 in such a way that reduces the mechanical resonance interference of the PWB 10 with the operation of at least selected devices mounted to the PWB 10.

Figure 2:
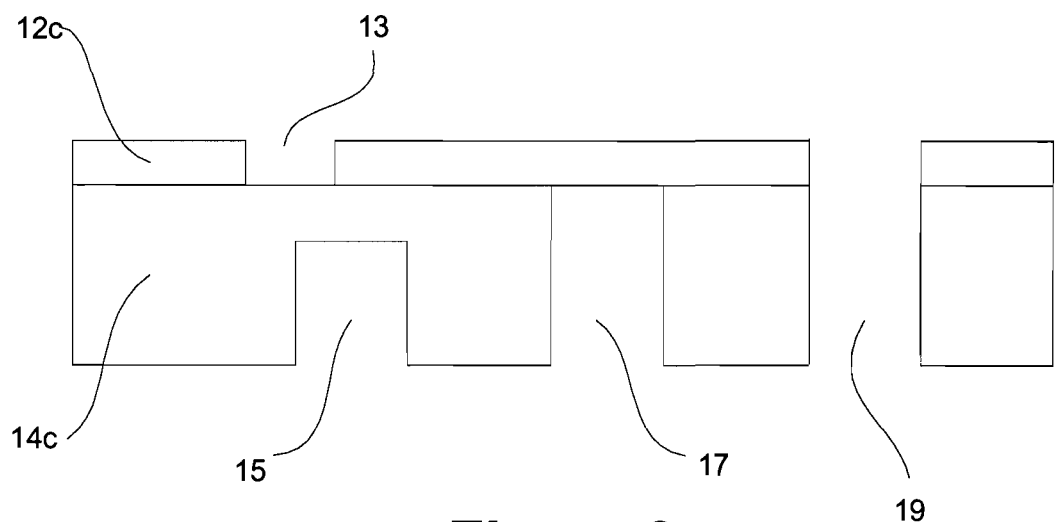
FIG. 2 is a schematic cross-sectional side view of an illustrative intermediate layer set of the PWB 10 of FIG. 1.

FIG. 2 is a schematic cross-sectional side view of an illustrative intermediate layer set 12c and 14c of the PWB 10 of FIG. 1. As illustrated, insulating layer 14c may include a conductive layer 12c situated thereon. In some cases, the conductive layer 12c may be copper, aluminum, gold or any other suitable conductive material, and the insulating layer 14 may be an oxide, ceramic, fiberglass or any other suitable material. The conductive layer 12c may be patterned by printing, etching, or by any other suitable technique, leaving traces, power busses, shielding regions, bond pads, etc. To form the desired pattern, some portions of conductive layer 12c may be removed or not provided, such as in region 13. The traces provided by the conductive layer 12c may provide electrical connections between different parts of PWB 10. In some cases, there may be one or more Vias that extend through certain insulating and/or conducting layers to help form electrical connections between conducting traces or pads.

In the illustrative embodiment, a portion of layer 14c may be selectively removed to form a structure that may substantially maintain the stiffness of the PWB 10 and have a relatively uniform stiffness across the PWB 10. In some cases, the selective removal step may remove a portion of one or more non-critical regions of the insulating layer 14c. In some cases, a portion of the conducting layer 12c may also be selectively removed with the non-critical region of the insulating layer 14, but this is not required. The selective removal step may, for example, remove the entire thickness of the layer 14c as shown at 17, only part of the thickness of layer 14c as shown at 15, or the entire thickness of layer 14c and layer 12c, as shown at 19.

Figure 3:
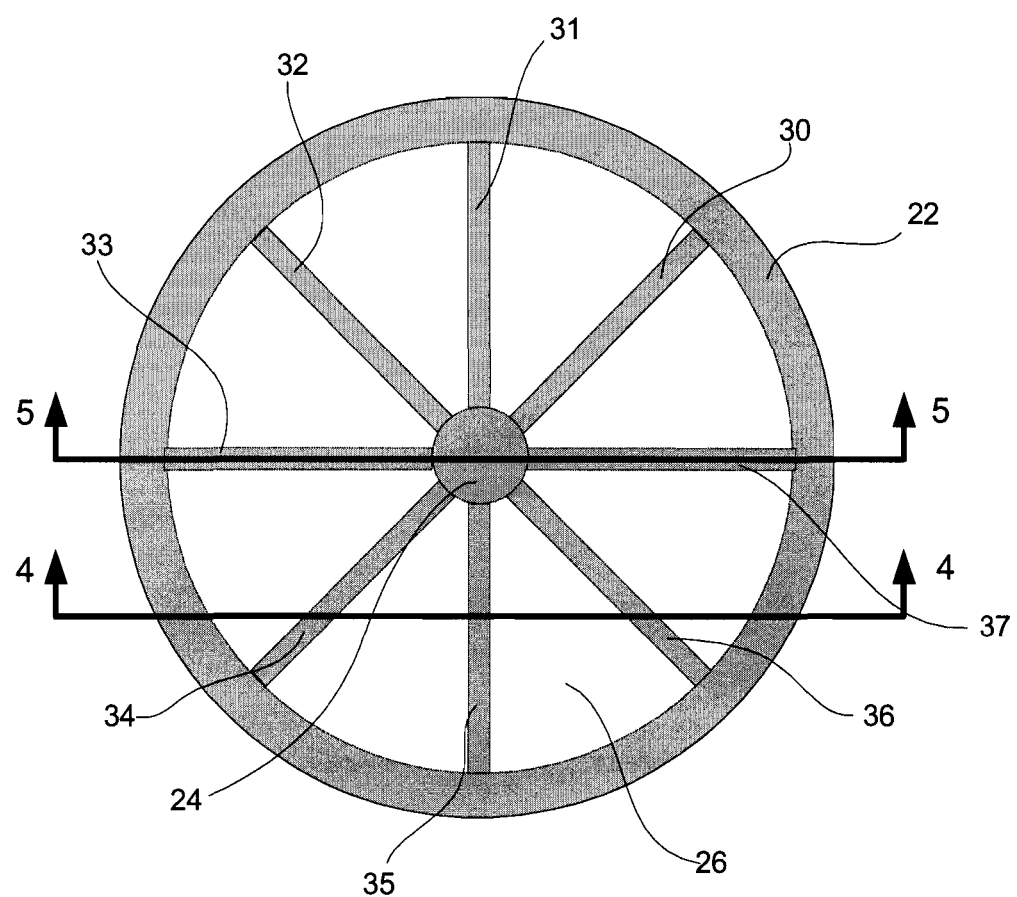
FIG. 3 is a schematic cross-sectional top view of one or more illustrative layers of a PWB having a hub and spoke pattern.

FIG. 3 is a schematic cross-sectional top view of one or more intermediate layers of a PWB having a hub and spoke pattern. In the illustrative embodiment, layers 12b-12c and 14b-14c, and in some cases 12a, 12d, 14a and 14d, may all have a similar cross-sectional top view pattern. The illustrative hub and spoke pattern may have an annular shaped perimeter 22, a hub 24 in the middle, and multiple spokes 30, 31, 32, 33, 34, 35, 36, and 37 extending between the hub 24 and the perimeter 22. As can be seen, in this illustrative pattern, the non-critical lighter weight regions 26 may be pie shaped. In some cases, a component such as a MEMS gyroscope, may be mounted above the hub 24, but this is not required. When so provided, the hub 24 may provide support between the upper surface of the PWB 10 and the lower surface. While not required, the support in or around the component mounting location may be useful in some high-G applications, where significant force may be exerted by the component 18 on the PWB 10 during a high-G event.

Figure 4:
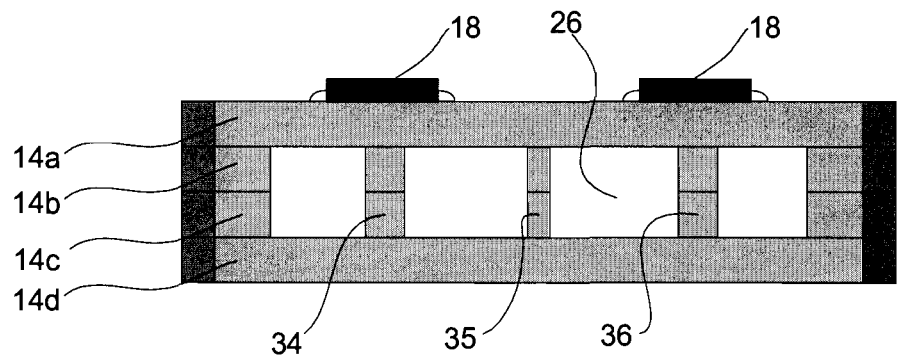
FIG. 4 is a schematic cross-sectional side view of the illustrative PWB of FIG. 3, taken along line 4-4.

FIG. 4 is a schematic cross-sectional side view of the illustrative PWB 10 of FIG. 3, taken along line 4-4. In this illustrative view, the conductive layers 12a-12d are not shown but they may be present. As can be seen, the illustrative PWB 10 includes four insulating layers 14a-14d stacked together (sometimes with intervening conducting layers 12a-12d). In the illustrative PWB 10 of FIG. 4, top layer 14a and bottom layer 14d do not have any portions selectively removed. However, it is contemplated that a portion of top layer 14a and/or bottom layer 14d may be selectively removed, if desired.

Figure 5:
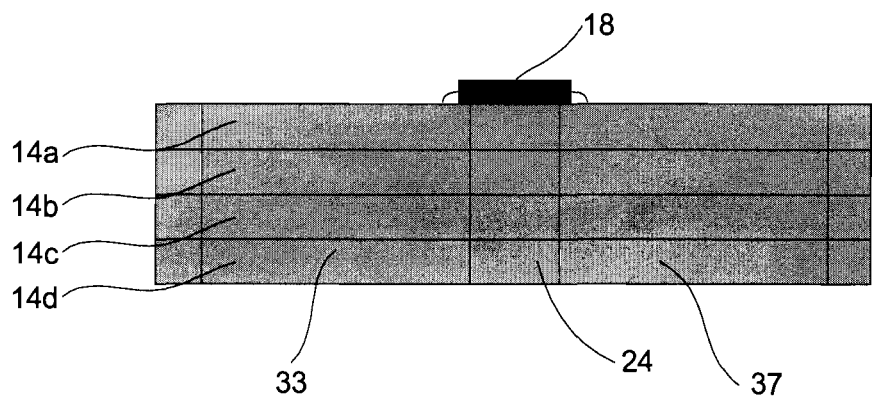
FIG. 5 is a schematic cross-sectional side view of the illustrative PWB of FIG. 3, taken along line 5-5.

Pie-shaped lighter weight regions 26 may be selectively removed to form column like structures 34, 35, and 36, which in FIG. 4, correspond to spokes 34, 35, and 36 of FIG. 3. In some embodiments, components 18 may be mounted on the top layer, and sometimes on the bottom layer. As shown in FIG. 5, the components 18 are positioned above one or more of the column like structures (e.g. spokes) 34, 35, and 36. As noted above, and in some embodiments, a component such as a MEMS gyroscope, may be mounted above the hub 24, which may also be supported by a support as better shown in FIG. 5. In either case, the spokes 30, 31, 32, 33, 34, 35, 36, and 37 and the hub 24 may provide support between the upper surface of the PWB 10 and the lower surface. In some cases, the one or more pie shaped lighter weight regions 26 may be sized and positioned so that the stiffness of the substrate is relatively uniform across the substrate 16. While not required, having a relatively uniform stiffness across the substrate 16 may help the PWB 10 remain relatively flat during a high-G event.

FIG. 5 is a schematic cross-sectional side view of the illustrative PWB 10 of FIG. 3, taken along line 5-5. As in FIG. 4, in this illustrative view, the conductive layers 12a-12d are not shown, but they may be present. As noted above with respect to FIG. 3, pie-shaped regions 26 may be selectively removed. This forms column like structures 33, 24 and 37, which in FIG. 5, correspond to spoke 33, hub 24 and spoke 37 of FIG. 3. In the illustrative embodiment shown in FIG. 5, a component 18 such as a MEMS gyroscope, may be mounted above the hub 24. While not required, the support 24 in or around the component mounting location may be useful in some high-G applications, where significant force may be exerted by the components 18 on the PWB 10 during a high-G event.

Figure 6:
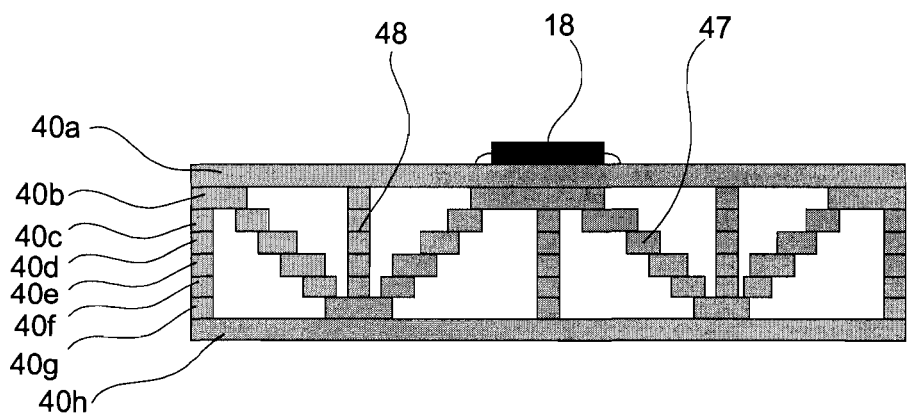
FIG. 6 is a schematic cross-sectional side view of another illustrative embodiment of PWB of FIG. 1, taken along 5-5 of FIG. 3.

FIG. 6 is a schematic cross-sectional side view of another illustrative embodiment of PWB 10, taken along 5-5 of FIG. 3. As illustrated, the PWB 10 may include eight insulating layers 40a-40h stacked together, instead of the four insulating layers 14a-d previously shown. Again, this is only illustrative and any number of layers may be used, as desired. As in FIG. 4 and FIG. 5, conductive layers such as conductive layers 12a-12d are not shown, but they may be present.

In the illustrative embodiment of FIG. 6, the PWB 10 may have pillars 48 and diagonals 47, which may help provide support and strength for the PWB 10. The layers 40a-40h may have different areas selectively removed. In the illustrative embodiment, the layers 40a-40h have portions selectively removed so that the portions of adjacent layers 40a-40h overlap, at least partially, forming the diagonals 47 of the structure. The structure may further include pillars 48 to provide more support to the structure, if desired. More generally, it is contemplated that the illustrative PWB 10 may include only diagonals 47, only pillars 48, or any other structure or combination of structures, as desired. Furthermore, the illustrative PWB 10 may have component 18 mounted thereon. In some cases, a component 18 such as a MEMS gyroscope may be mounted above one or more of the pillars, as shown, or elsewhere.

Figure 7:
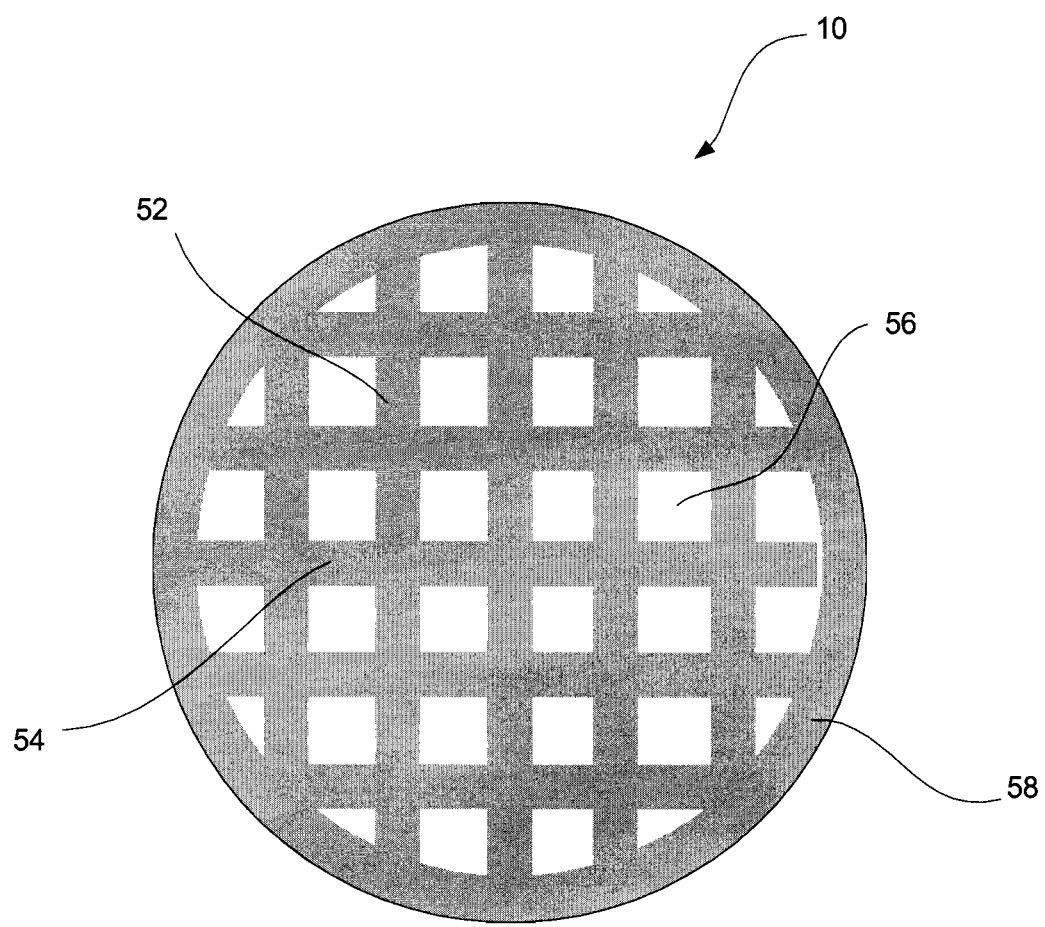
FIG. 7 is a schematic cross-sectional top view of one or more of the layers of another illustrative embodiment of the PWB of FIG. 1.

FIG. 7 is a schematic cross-sectional top view of one or more of the layers of another illustrative embodiment of PWB 10. The illustrative PWB 10 has a number of non-critical lighter weight regions 56 selectively removed in a pattern. The pattern may be a one dimensional pattern, a two dimensional pattern, or a three dimensional pattern, as desired. The pattern may be a regular pattern, such as a pattern having a number of rows and columns of spaced square, rectangular or other shaped lighter weight regions as shown in FIG. 7. Other illustrative regular patterns may include honeycomb patterns (see FIG. 8), hub and spoke patterns (see FIG. 3), or any other suitable regular pattern, as desired. The pattern may also be a non-regular pattern, or even a pseudo random pattern, as desired. In some cases, the pattern may extend across a majority of the area defined by the perimeter 58 of the substrate, but this is not required. The one or more non-critical lighter weight regions 56 may be filled with a gas such as air, and/or a lighter weight solid or liquid, as desired.

For the checker board pattern shown in FIG. 7, there is a first set of five beams 52 in a vertical direction and a second set of five beams 54 in a horizontal direction. However, it is contemplated that there may be any number of beams 52 in the first set and any number of beams 54 in the second set, and any number of sets, as desired. The illustrative beams 52 and 54 may form a lattice-like structure that may help provide support to the PWB 10.

Figure 8:
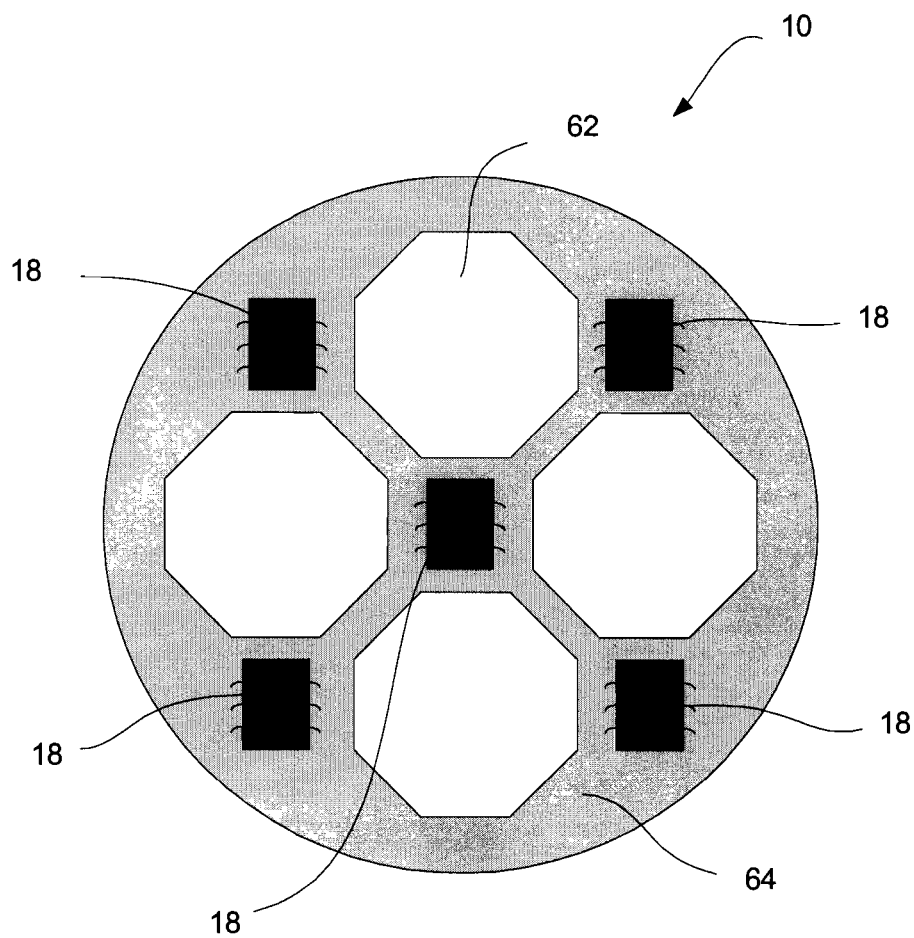
FIG. 8 is a schematic cross-sectional view of one or more of the layers of another illustrative embodiment of the PWB of FIG. 1.

FIG. 8 is a schematic cross-sectional view of one or more of the layers of another illustrative embodiment of PWB 10. The illustrative PWB 10 has a number of non-critical lighter weight regions 62 selectively removed in a pattern. In the illustrative embodiment shown in FIG. 8, the pattern is a honeycomb pattern. For the honeycomb pattern shown in FIG. 8, four octagonal-shaped regions are selectively removed. It is contemplated that components 18 may be positioned between the four octagonal-shaped regions, but this is not required.

Figure 9:
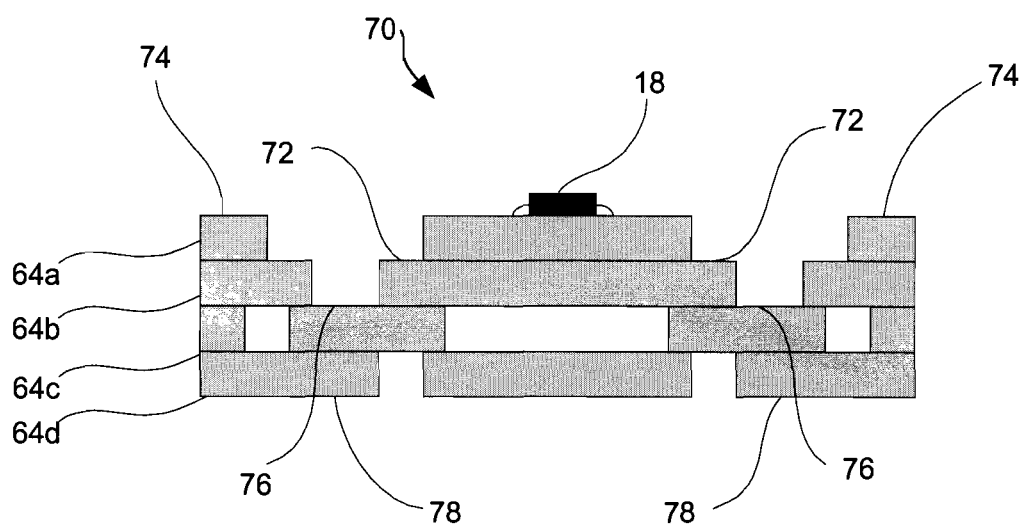
FIG. 9 is a schematic cross-sectional view of one or more of the layers of another illustrative embodiment of a PWB.

FIG. 9 is a schematic cross-sectional view of one or more of the layers of another illustrative embodiment of a PWB 70. In the illustrative embodiment, a top layer 64a may have portions selectively removed. Furthermore, illustrative intermediate layers 64b-64c may also have regions selectively removed. Also, the bottom layer 64d may have regions selectively removed. The removed portions form a number of lighter weight regions. The illustrative layers 64a-d may overlay one another, at least partially, to help provide support for the PWB 70. As illustrated, a component 18 may be mounted on top layer 64a in a region of top layer 64a that has not been removed. However, it is also contemplated that component 18 may be mounted in regions 72, 74, 76, and/or 78 on intermediate layers 64b-64c and/or bottom layer 64d, if desired.

Having thus described the preferred embodiments of the present invention, those of skill in the art will readily appreciate that yet other embodiments may be made and used within the scope of the claims hereto attached. Numerous advantages of the invention covered by this document have been set forth in the foregoing description. It will be understood, however, that this disclosure is, in many respect, only illustrative. Changes may be made in details, particularly in matters of shape, size, and arrangement of parts without exceeding the scope of the invention. The invention's scope is, of course, defined in the language in which the appended claims are expressed.

What is claimed is:

1. A light weight printed wiring board (PWB), comprising:
a substrate comprising a plurality of layers extending generally parallel to a plane, the substrate defining an upper surface and a lower surface, wherein at least the upper surface comprises one or more component mounting locations that are adapted to mount a component,
the substrate comprising one or more lighter weight regions in which non-critical regions of the substrate have been selectively removed to reduce the overall weight of the substrate,
wherein the one or more lighter weight regions are situated between the upper surface and the lower surface of the substrate, but do not extend through the upper surface and do not extend through the lower surface of the substrate,
wherein portions of the substrate within the one or more lighter weight regions define at least one structure between the lower surface and the upper surface of the substrate, and
wherein the one or more lighter weight regions are filled with a solid comprising a lighter weight than the selectively removed non-critical regions of the substrate.

2. The light weight PWB of claim 1, wherein the one or more lighter weight regions correspond to regions where two or more of the layers of the substrate have been removed.

3. The light weight PWB of claim 1, wherein the at least one structure comprises a column and a diagonal beam.

4. The light weight PWB of claim 1, wherein the at least one structure comprises a diagonal structure formed by adjacent layers of the plurality of layers of the substrate partially overlapping.

5. The light weight PWB of claim 1, wherein the at least one structure comprises at least one of a truss structure, a beam, or a column-like structure.

6. The light weight PWB of claim 1, wherein the substrate comprises two or more lighter weight regions, wherein the two or more lighter weight regions form a pattern.

7. The light weight PWB of claim 6, wherein the pattern is at least a one dimensional pattern.

8. The light weight PWB of claim 6, wherein the pattern extends across a majority of an area defined by the perimeter of the substrate.

9. The light weight PWB of claim 6, wherein the pattern is at least a two dimensional pattern.

10. The light weight PWB of claim 9, wherein the pattern is a regular pattern.

11. The light weight PWB of claim 9, wherein the pattern includes rows and columns of spaced square or rectangular lighter weight regions.

12. The light weight PWB of claim 9, wherein the pattern is a honeycomb pattern.

13. The light weight PWB of claim 9, wherein the pattern is a hub and spoke pattern.

14. The light weight PWB of claim 1, wherein the one or more lighter weight regions are filled with a gas comprising a lighter weight than the selectively removed non-critical regions of the substrate.

15. The light weight PWB of claim 1, wherein the plurality of layers of the substrate extend from at least part of the upper surface that corresponds to a component mounting location to the lower surface of the substrate so that support is not substantially reduced between the lower surface and the upper surface of the substrate at the component mounting location.

16. A light weight printed wiring board (PWB), comprising:
a substrate comprising a plurality of layers extending generally parallel to a plane, the substrate defining an upper surface and a lower surface, wherein at least the upper surface comprises one or more component mounting locations that are adapted to mount a component,
the substrate comprising two or more lighter weight regions in which non-critical regions of the substrate have been selectively removed to reduce the overall weight of the substrate,
wherein the two or more lighter weight regions are situated between the upper surface and the lower surface of the substrate, but do not extend through the upper surface and do not extend through the lower surface of the substrate;
wherein the plurality of layers of the substrate extend from at least part of the upper surface that corresponds to a component mounting location to the lower surface of the substrate so that support is not substantially reduced between the lower surface and the upper surface of the substrate at the component mounting location, and
wherein portions of the substrate within the two or more lighter weight regions form a pattern comprising at least one of a honeycomb pattern or a hub and spoke pattern.

17. A light weight printed wiring board (PWB), comprising:
a substrate comprising a plurality of layers extending generally parallel to a plane, the substrate defining an upper surface and a lower surface, wherein at least the upper surface comprises one or more component mounting locations that are adapted to mount a component,
the substrate comprising one or more lighter weight regions in which non-critical regions of the substrate have been selectively removed to reduce the overall weight of the substrate,
wherein the one or more lighter weight regions are situated between the upper surface and the lower surface of the substrate, but do not extend through the upper surface and do not extend through the lower surface of the substrate;
wherein the plurality of layers of the substrate extend from at least part of the upper surface that corresponds to a component mounting location to the lower surface of the substrate so that support is not substantially reduced between the lower surface and the upper surface of the substrate at the component mounting location, and
wherein the one or more lighter weight regions are filled with a solid comprising a lighter weight than the selectively removed non-critical regions of the substrate.

* * * * *

UNITED STATES PATENT AND TRADEMARK OFFICE
CERTIFICATE OF CORRECTION

| | | |
|---|---|---|
| PATENT NO. | : 8,703,278 B2 | Page 1 of 1 |
| APPLICATION NO. | : 11/277668 | |
| DATED | : April 22, 2014 | |
| INVENTOR(S) | : Weber | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1104 days.

Signed and Sealed this
Eighth Day of September, 2015

Michelle K. Lee
*Director of the United States Patent and Trademark Office*